United States Patent
Lee et al.

(10) Patent No.: US 12,426,484 B2
(45) Date of Patent: Sep. 23, 2025

(54) DISPLAY DEVICE

(71) Applicant: Samsung Display Co., LTD., Yongin-si (KR)

(72) Inventors: Duk Jin Lee, Suwon-si (KR); Beong-Hun Beon, Hwaseong-si (KR); Tae Yong Eom, Suwon-si (KR); Hyo Sung Hong, Hwaseong-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 18/086,622

(22) Filed: Dec. 21, 2022

(65) Prior Publication Data

US 2023/0200121 A1 Jun. 22, 2023

(30) Foreign Application Priority Data

Dec. 22, 2021 (KR) .......................... 10-2021-0184751

(51) Int. Cl.
*H10K 50/86* (2023.01)
*G06F 3/044* (2006.01)
*H10K 59/40* (2023.01)
*H10K 59/12* (2023.01)

(52) U.S. Cl.
CPC .......... *H10K 50/86* (2023.02); *G06F 3/0443* (2019.05); *G06F 3/0446* (2019.05); *H10K 59/40* (2023.02); *G06F 2203/04111* (2013.01); *H10K 59/12* (2023.02)

(58) Field of Classification Search
CPC ................ G06F 3/0443; G06F 3/0446; G06F 2203/04111; G06F 2203/04103; G06F 3/0412; G06F 3/0445; G06F 2203/04112; G06F 3/041; H10K 59/40; H10K 50/86; H10K 59/12
See application file for complete search history.

(56) References Cited

U.S. PATENT DOCUMENTS

| 2013/0278513 A1* | 10/2013 | Jang ...................... G06F 3/0445 345/173 |
| 2015/0060125 A1* | 3/2015 | Stevenson ............. G06F 3/0446 174/261 |
| 2016/0139705 A1* | 5/2016 | Park ...................... G06F 3/0446 345/174 |

(Continued)

FOREIGN PATENT DOCUMENTS

| CN | 108666357 B | * 1/2021 |
| JP | 2014142462 | 8/2014 |

(Continued)

*Primary Examiner* — Md Saiful A Siddiqui
(74) *Attorney, Agent, or Firm* — CANTOR COLBURN LLP

(57) ABSTRACT

A display device includes a display unit including: a plurality of light emitting diodes; a touch unit disposed on the display unit and including a touch conductive layer of a mesh type; and a reflection preventing unit disposed on the touch unit and including a polarization layer. The touch conductive layer includes a plurality of first conductive lines extending in a first direction and a plurality of second conductive lines extending in a second direction crossing the first direction, and an angle between the second direction and an absorption axis of the polarization layer is about 5±10°.

20 Claims, 12 Drawing Sheets

(56) References Cited

U.S. PATENT DOCUMENTS

| | | | |
|---|---|---|---|
| 2016/0202802 A1* | 7/2016 | Ono | G06F 3/0412 |
| | | | 345/174 |
| 2017/0131804 A1* | 5/2017 | Sata | B32B 27/306 |
| 2017/0344162 A1* | 11/2017 | Lee | G06F 3/0446 |
| 2018/0159085 A1* | 6/2018 | Yoshida | H10K 50/00 |
| 2019/0151807 A1* | 5/2019 | Tago | B01F 21/221 |
| 2019/0177577 A1* | 6/2019 | Yamasaki | H10K 50/86 |
| 2019/0255807 A1* | 8/2019 | Isojima | H05B 33/02 |
| 2020/0117304 A1 | 4/2020 | Lee et al. | |
| 2020/0161589 A1* | 5/2020 | Konishi | G09F 9/30 |
| 2020/0249793 A1* | 8/2020 | Xu | G06F 3/0446 |
| 2023/0168419 A1* | 6/2023 | Zhang | G02B 5/3025 |
| | | | 349/193 |
| 2024/0094855 A1* | 3/2024 | Zhang | G06F 3/0448 |

FOREIGN PATENT DOCUMENTS

| | | |
|---|---|---|
| KR | 20090005770 A | 1/2009 |
| KR | 101700772 | 1/2017 |
| KR | 101756656 | 7/2017 |
| KR | 20200042995 A | 4/2020 |
| KR | 1020210023001 | 3/2021 |
| KR | 1020210068051 | 6/2021 |

\* cited by examiner

DISPLAY DEVICE

This application claims priority to Korean Patent Application No. 10-2021-0184751, filed on Dec. 22, 2021, and all the benefits accruing therefrom under 35 U.S.C. § 119, the content of which in its entirety is herein incorporated by reference.

BACKGROUND

(a) Field

This disclosure relates to a display device, and more particularly, to a display device including a display unit, a touch unit, and a reflection preventing unit.

(b) Description of the Related Art

A display device such as an emissive display device may include a touch sensing function capable of interacting with a user in addition to a function of displaying an image. The touch detection function may detect changes in pressure, charge, light, etc. applied to a screen of the display device when a user touches a finger on the screen to detect touch information such as whether an object has been touched on the screen and a touch position thereof. The display device may receive an image signal based on the touch information.

The touch sensing function may be implemented by a touch sensor including a touch electrode. Forming the touch electrode using a metal mesh may reduce parasitic capacitance and luminance deterioration caused by the touch electrode and may be advantageous in realizing a flexible display device.

SUMMARY

A display device may include a reflection preventing unit for reducing reflection of external light. In a case where the display device includes a touch sensor, even if the display device includes the reflection preventing unit, the external light may be reflected by a touch conductive layer and the pattern of the touch conductive layer may be visually recognized. In particular, when the pattern of the touch conductive layer has a curved surface, the reflected light leaks out of the reflection preventing unit due to the phase shift of the reflected light, such that the pattern of the touch conductive layer may be recognized better.

Embodiments are to provide a display device including an improved reflection preventing unit.

According to an embodiment of the invention, a display device includes a display unit including a plurality of light emitting diodes, a touch unit disposed on the display unit and including a touch conductive layer of a mesh type, and a reflection preventing unit disposed on the touch unit and including a polarization layer. In such an embodiment, the touch conductive layer may include a plurality of first conductive lines extending in a first direction and a plurality of second conductive lines extending in a second direction crossing the first direction, and an angle between the second direction and an absorption axis of the polarization layer is about 5±10°.

In an embodiment, the reflection preventing unit may further include a first phase retardation layer disposed between the touch unit and the polarization layer and having a $\lambda/4$ phase retardation value, and a second phase retardation layer disposed between the first phase retardation layer and the polarization layer and having a $\lambda/2$ phase retardation value.

In an embodiment, an angle between the absorption axis and an optical axis of the first phase retardation layer may be about 12.5±5°.

In an embodiment, an angle between the absorption axis and an optical axis of the second phase retardation layer may be about 72.5±5°.

In an embodiment, the reflection preventing unit may further include a third phase retardation layer disposed on the polarization layer and having a $\lambda/4$ phase retardation value.

In an embodiment, an angle between the absorption axis and an optical axis of the third phase retardation layer may be about −45° or about 45°.

In an embodiment, the touch conductive layer may include a first touch conductive layer and a second touch conductive layer disposed in different layers from each other with an insulating layer interposed therebetween.

In an embodiment, the touch unit may include a first insulating layer, a first touch conductive layer disposed on the first insulating layer, a second insulating layer disposed on the first touch conductive layer, and a second touch conductive layer disposed on the second insulating layer.

In an embodiment, the second touch conductive layer may include a plurality of first touch electrodes arranged in the first direction, a plurality of second touch electrodes arranged in the second direction, and a plurality of first bridges connecting the plurality of first touch electrodes to each other. In such an embodiment, the first touch conductive layer may include a plurality of second bridges connecting the plurality of second touch electrodes to each other.

In an embodiment, a portion constituting the first bridge among the plurality of first conductive lines may overlap a portion constituting the second bridge among the plurality of second conductive lines.

According to an embodiment of the invention, a display device includes: a display unit including pixels; a touch unit disposed on the display unit, where the touch unit includes a first touch conductive layer and a second touch conductive layer; and a reflection preventing unit disposed on the touch unit, where the reflection preventing unit includes a first phase retardation layer, a second phase retardation layer, and a polarization layer. In such an embodiment, each of the first touch conductive layer and the second touch conductive layer may include a first conductive line extending in a horizontal direction and a second conductive line extending in a vertical direction, and an angle between an extension direction of the second conductive line and an absorption axis of the polarization layer may be about 5±10°.

In an embodiment, the first phase retardation layer may have a $\lambda/4$ phase retardation value, and the second phase retardation layer may have a $\lambda/2$ phase retardation value.

In an embodiment, an angle between the absorption axis and an optical axis of the first phase retardation layer may be about 12.5±5°.

In an embodiment, the angle between the absorption axis and the optical axis of the second phase retardation layer may be about 72.5±5°.

In an embodiment, the first phase retardation layer, the second phase retardation layer, and the polarization layer may be sequentially disposed on the touch unit.

In an embodiment, the reflection preventing unit may further include a third phase retardation layer having a $\lambda/4$ phase retardation value.

In an embodiment, an angle between the absorption axis and an optical axis of the third phase retardation layer may be about −45° or about 45°.

In an embodiment, the touch unit may further include a first insulating layer, and a second insulating layer disposed on the first touch conductive layer, where the first touch conductive layer may be disposed on the first insulating layer, and the second touch conductive layer may be disposed on the second insulating layer.

In an embodiment, the second touch conductive layer may include a plurality of first touch electrodes, a plurality of second touch electrodes, and a plurality of first bridges connecting the plurality of first touch electrodes to each other, and the first touch conductive layer may include a plurality of second bridges connecting the plurality of second touch electrodes to each other.

In an embodiment, the first conductive line of the second touch conductive layer may include a portion overlapping the second conductive line of the first touch conductive layer.

According to embodiments, the display device includes the reflection preventing unit such that the recognition of the pattern of the touch conductive layer may be reduced.

DETAILED DESCRIPTION

Figure 1:
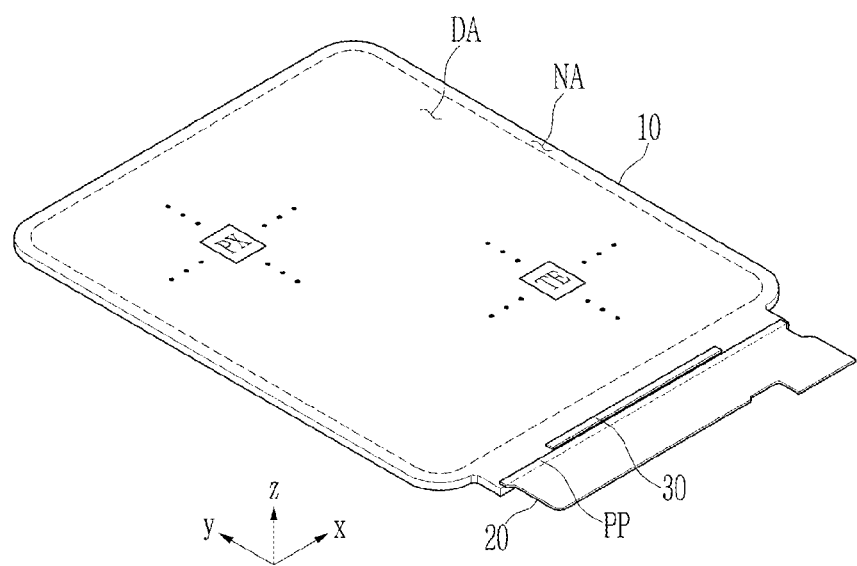
FIG. 1 is a schematic perspective view of a display device according to an embodiment.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element such as a layer, film, region, or substrate is referred to as being "on" another element, it can be directly on the other element or intervening elements may also be present. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Throughout the specification, "connected" does not only mean that two or more constituent elements are directly connected, but when two or more constituent elements are connected indirectly through other constituent elements, and it may include a case where substantially integral parts are connected to each other even if they may be referred to by a different name depending on the position or function, as well as the case of being physically connected or electrically connected.

In the drawings, symbols "x", "y", and "z" representing directions are used, where "x" is a first direction, "y" is a second direction perpendicular to the first direction, and "z" is a third direction perpendicular to the first direction and the second direction.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments of the invention will be described in detail with reference to the accompanying drawings.

FIG. 1 is a schematic perspective view of a display device according to an embodiment.

Referring to FIG. 1, an embodiment of a display device, which may be an emissive display device, may include a display panel 10, a flexible printed circuit film 20 connected or bonded to the display panel 10, and a driving device including an integrated circuit chip 30, etc.

The display panel 10 includes a display area DA corresponding to a screen, in which an image is displayed, and a non-display area NA, in which circuits and/or signal lines for generating and/or transmitting various signals applied to the display area DA are disposed, around the display area DA. The non-display area NA may surround the display area DA. In FIG. 1, the inner and outer sides of the dotted line quadrangle may correspond to the display area DA and the non-display area NA, respectively.

Pixels PX may be disposed in a matrix form in the display area DA of the display panel 10. In addition, signal lines such as a gate line (also referred to as a scan line), a data line, and a driving voltage line may be disposed in the display area DA. The scan line, the data line, the driving voltage line, and the like are connected to each pixel PX, and each pixel PX may receive a scan signal, a data signal, and a driving voltage from such lines. The pixel PX may be implemented as a light-emitting element such as a light emitting diode (LED).

In the display area DA, touch electrodes TE for sensing a user's contact and/or non-contact touch may be disposed. In an embodiment, as shown in FIG. 1, the display area DA, which is generally a quadrangle, but not being limited thereto. Alternatively, the display area DA may have various shapes other than a quadrangle, such as a polygon, a circle, an oval, etc.

In the non-display area NA of the display panel 10, a pad portion PP in which pads for receiving signals from the outside of the display panel 10 are arranged may be positioned. The pad portion PP may be positioned long in the first direction x along one edge of the display panel 10. The flexible printed circuit film 20 may be bonded to the pad portion PP, and the pads of the flexible printed circuit film 20 may be electrically connected to the pads of the pad portion PP.

A driving unit that generates and/or processes various signals for driving the display panel 10 may be positioned in the non-display area NA of the display panel 10. The driving unit includes a data driver that applies a data voltage to data lines, a gate driver that applies a gate signal to gate lines, and a signal controller that controls the data driver and the gate driver. The driving unit may further include a touch controller that applies a driving signal to the touch electrode TE and receives an output signal of the touch electrode TE to generate touch information. The pixels PX may receive a data voltage at predetermined timing in response to a gate signal generated by a gate driver. The gate driver may be integrated on the display panel 10 and positioned on at least one side of the display area DA. The data driver and the signal controller may be provided as an integrated circuit chip (also referred to as a driving IC chip) 30, and the integrated circuit chip 30 may be mounted in the non-display area NA of the display panel 10. The integrated circuit chip 30 may be mounted on a flexible printed circuit film 20 or the like and electrically connected to the display panel 10.

Figure 2:
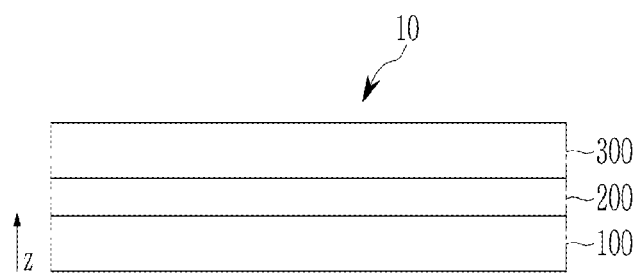
FIG. 2 is a schematic cross-sectional view of a display panel of a display device according to an embodiment.

FIG. 2 is a schematic cross-sectional view of a display panel in a display device according to an embodiment.

Referring to FIG. 2, an embodiment of the display panel 10 may include a display unit 100, a touch unit 200, and a reflection preventing unit 300. The display unit 100 is a part in which components for displaying an image are disposed, and may include the pixels PX. The touch unit 200 is a part in which components for sensing a touch are disposed, and may include the touch electrodes TE. The touch unit 200 may be positioned on the display unit 100. The reflection preventing unit 300 is a part for reducing light reflected by the display unit 100 and the touch unit 200, and may include a phase retardation layer and a polarization layer. The reflection preventing unit 300 may be positioned on the touch unit 200. The touch unit 200 may be formed on or attached to the display unit 100. The reflection preventing unit 300 may be attached or formed on the touch unit 200.

Figure 3:
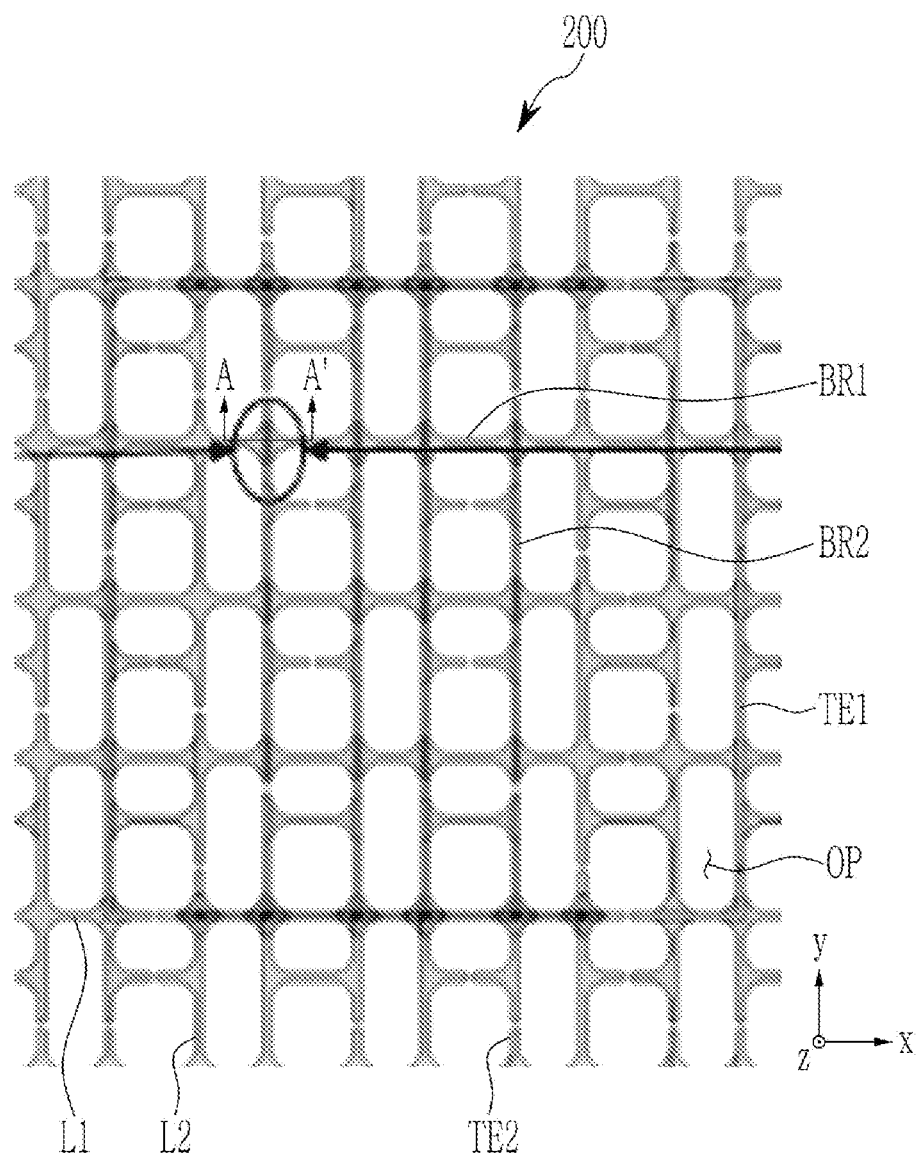
FIG. 3 is a top plan view of a touch unit in a display device according to an embodiment.
Figure 4:
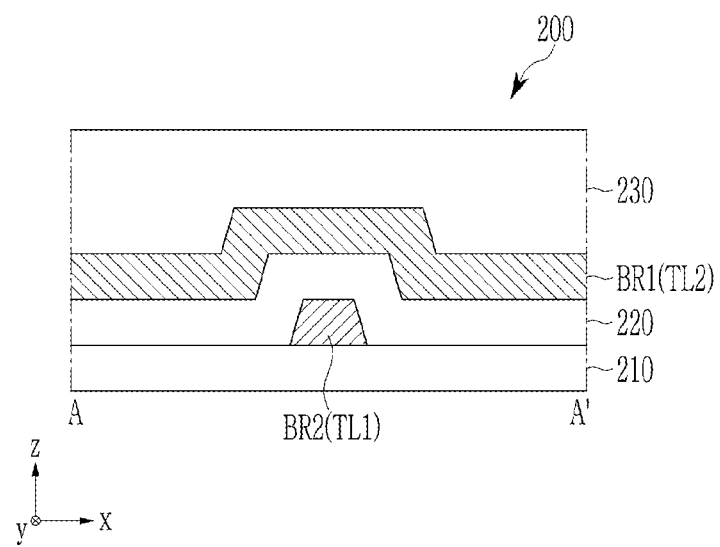
FIG. 4 is a schematic cross-sectional view taken along line A-A' in FIG. 3.

FIG. 3 is a top plan view of a touch unit in a display device according to an embodiment, and FIG. 4 is a schematic cross-sectional view taken along line A-A' in FIG. 3.

Referring to FIG. 3, portions of the adjacent four touch electrodes TE1 and TE2 are shown. The touch unit 200 may include first touch electrodes TE1 arranged in a first direction x and second touch electrodes TE2 arranged in a second direction y. The first direction x and the second direction y may correspond to horizontal and vertical directions of the display panel 10, respectively. Each of the touch electrodes TE1 and TE2 may have a polygonal planar shape such as a quadrangle, a rhombus, and a triangle as a whole. The touch unit 200 may include a first bridge BR1 connecting the adjacent first touch electrodes TE1 to each other and a second bridge BR2 connecting the adjacent second touch electrodes TE2 to each other. The adjacent first touch electrode TE1 and second touch electrode TE2 may form a mutual sensing capacitor. One of the first touch electrode TE1 and the second touch electrode TE2 may be connected to a touch signal line for transmitting a driving signal, the other may be connected to a touch signal line for transmitting an output signal, and the touch signal lines may be connected to a touch controller.

Referring FIG. 3 and to FIG. 4, the touch electrodes TE1 and TE2 and the bridges BR1 and BR2 may be in a mesh shape. In an embodiment, for example, the touch electrodes TE1 and TE2 and the bridges BR1 and BR2 may be formed of or defined by a metal mesh in which first conductive lines L1 extending in the first direction x and second conductive lines L2 extending in the second direction y intersect with each other. An opening OP defined by the metal mesh may be an approximate rectangle. The second bridge BR2 may have an approximate ladder shape, and a short side and a long side may be parallel to the first direction x and the second direction y, respectively.

The metal mesh may be formed of or defined by a plurality of layers. In an embodiment, for example, the touch unit 200 may include a first touch conductive layer TL1 including the second bridge BR2 and a second touch conductive layer TL2 including the touch electrodes TE1 and TE2 and the first bridge BR1. Each of the first and second touch conductive layers TL1 and TL2 may be formed of or defined by a metal mesh in which the first conductive lines L1 extending in the first direction x and the second conductive lines L2 extending in the second direction y intersect with each other. The first touch conductive layer TL1 may be positioned on the first insulating layer 210, the second insulating layer 220 may be positioned between the first touch conductive layer TL1 and the second touch conductive layer TL2, and a passivation layer 230 may be positioned on the second touch conductive layer TL2. Accordingly, the second bridge BR2 may cross the first bridge BR1 while being insulated therefrom. Also, the second bridge BR2 and the second touch electrodes TE2 extending in the second direction y may be insulated from the first bridge BR1 and the first touch electrodes TE1 extending in the first direction x.

In the region where the second touch conductive layer TL2 does not overlap the first touch conductive layer TL1, the second touch conductive layer TL2 may be planar. However, in the region where the second touch conductive layer TL2 overlaps the first touch conductive layer TL1, for example, in the region where the first bridge BR1 overlaps the second bridge BR2, the second touch conductive layer TL2 may be bent in the third direction z. in a case where there is an inclined surface due to the curvature, a phase shift of reflected light may occur, such that the absorption rate of the reflected light by the reflection preventing unit 300 may deteriorate. Accordingly, the reflectance is increased in the bent portion of the second touch conductive layer TL2, such that the patterns of the touch conductive layers TL1 and TL2 may be recognized well. Also, since the inclined surface is inclined in the first direction x and the third direction z, the patterns of the touch conductive layers TL1 and TL2 may be well recognized when the display device is viewed from a side viewing angle corresponding to the first direction x.

Figure 5:
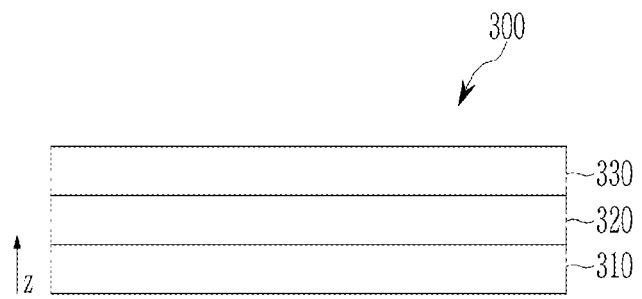
FIG. 5 is a schematic cross-sectional view of a reflection preventing layer in a display device according to an embodiment.
Figure 6:
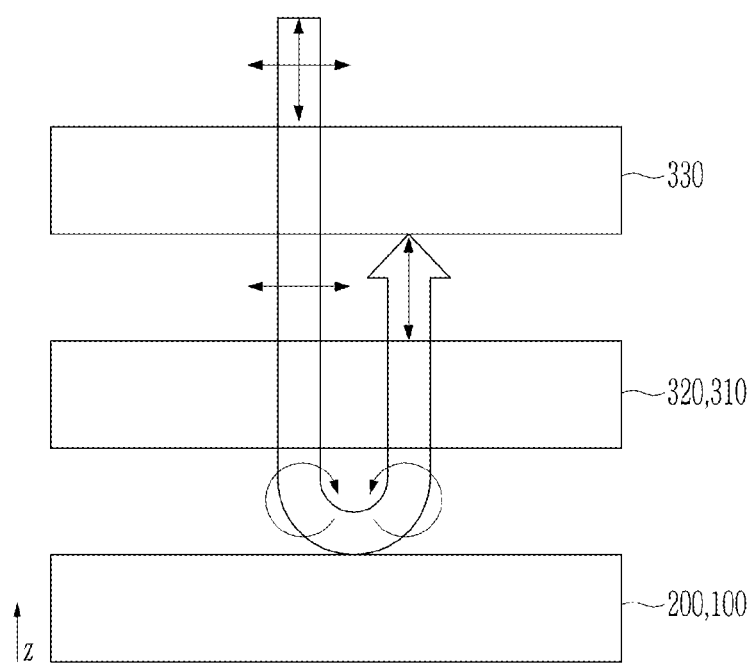
FIG. 6 is a schematic view showing a light path in a reflection preventing layer in a display device according to an embodiment.

FIG. 5 is a schematic cross-sectional view of a reflection preventing layer in a display device according to an embodiment, and FIG. 6 is a schematic view showing a light path in a reflection preventing layer in a display device according to an embodiment.

Referring to FIG. 5 and FIG. 6, an embodiment of the reflection preventing unit 300 may include a first phase retardation layer 310, a second phase retardation layer 320, and a polarization layer 330. The first phase retardation layer 310, the second phase retardation layer 320, and the polarization layer 330 may be sequentially positioned on the touch unit 200. The first phase retardation layer 310, the second phase retardation layer 320, and the polarization layer 330 may be combined with each other by a method such as adhesion, lamination, or coating.

The first phase retardation layer 310 may have a λ/4 phase retardation value, and the second phase retardation layer 320 may have a λ/2 phase retardation value. The polarization layer 330 may include a linear polarizer. In an embodiment, for example, the polarizer may be a polyvinyl alcohol polarizer. The polarization layer 330 may include a protective layer (e.g., triacetyl cellulose) for protecting the polarizer on opposing surfaces of the polarizer. The first phase retardation layer 310, the second phase retardation layer 320, and the polarization layer 330 may constitute a circular polarizer. In an embodiment, the first phase retardation layer 310 and the second phase retardation layer 320 may be arranged in a way such that the first phase retardation layer 310 and the second phase retardation layer 320 may collectively function as a broadband phase retardation layer.

Referring to FIG. 6, only linear polarization perpendicular to the absorption axis of the polarization layer 330 among the non-polarized light incident to the display device from the outside may pass through the polarization layer 330. The linearly polarized light passing through the polarization layer 330 may be converted into circularly polarized light while passing through the second phase retardation layer 320 and the first phase retardation layer 310. The circularly polarized light is reflected by an electrode of the touch unit 200 or the display unit 100, and then the circular polarization direction may be changed. The light of which the circular polarization direction is changed may be converted into the linear polarization parallel to the absorption axis of the polarization layer 330 while passing through the first phase retardation layer 310 and the second phase retardation layer 320. Therefore, since the light reflected by the electrodes of the touch unit 200 and the display unit 100 is absorbed by the polarization layer 330 and does not escape to the outside, the reflection of the external light may be effectively prevented.

Figure 7:
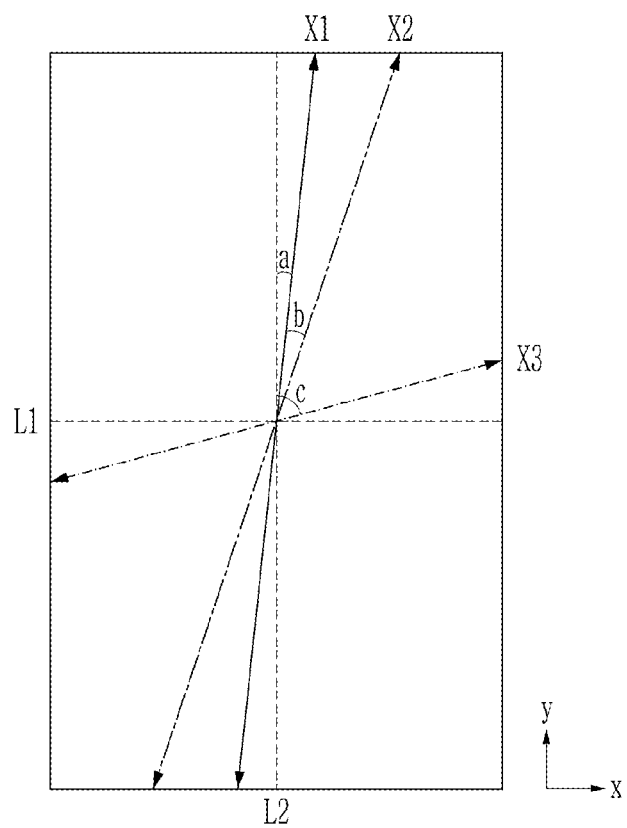
FIG. 7 is a view showing an arrangement of a reflection preventing unit in a display device according to an embodiment.

FIG. 7 is a view showing an arrangement of a reflection preventing unit in a display device according to an embodiment.

Referring to FIG. 7, the relationship between the first direction x and the second direction y, and the optical axis X1 of the polarization layer 330 of the reflection preventing unit 300, the optical axis X2 of the first phase retardation layer 310, and the optical axis X3 of the second phase retardation layer 320, represent the arrangement relationship of the reflection preventing unit 300. The optical axis X1 may be an absorption axis of the polarization layer 330, the optical axis X2 may be a slow axis of the first phase retardation layer 310, and the optical axis X3 may be a slow axis of the second phase retardation layer 320.

In an embodiment, the polarization layer 330 may be disposed in a way such that the angle a between the second direction y and the optical axis X1 is about 5±10°, that is, in a range of about −5° to about 15°. The second direction y may correspond to the extension direction of the second conductive line L2 constituting the metal mesh of the first and second touch conductive layers TL1 and TL2. Accordingly, the polarization layer 330 may be disposed in a way such that the angle a between the extension direction of the second conductive line L2 and the optical axis X1 is about 5±10°. In such an embodiment where the polarization layer 330 is disposed on the first and second touch conductive layers TL1 and TL2 as described above, leakage of the reflected light in the region where the second touch conductive layer TL2 overlaps the first touch conductive layer TL1 due to the bending of the second touch conductive layer TL2 may be reduced, and the patterns of the touch conductive layers TL1 and TL2 may be effectively prevented from being recognized by the reflected light or may be substantially less recognized.

In an embodiment, the first phase retardation layer 310 may be disposed in a way such that the angle b between the optical axis X1 and the optical axis X2 is about 12.5±5°, that is, in a range of about 7.5° to about 17.5°. Accordingly, the first phase retardation layer 310 may be disposed in a way such that the angle between the second direction y and the optical axis X2 is about 17.5±15°, that is, in a range of about 2.5° to about 32.5°. The second phase retardation layer 320 may be disposed in a way such that the angle c between the optical axis X1 and the optical axis X3 is about 72.5±5°, that is, in a range of about 67.5° to about 77.5°. Accordingly, the second phase retardation layer 320 may be disposed in a way such that the angle between the second direction y and the optical axis X3 is about 77.5±15°, that is, in a range of about 62.5° to about 92.5°.

Figure 8:
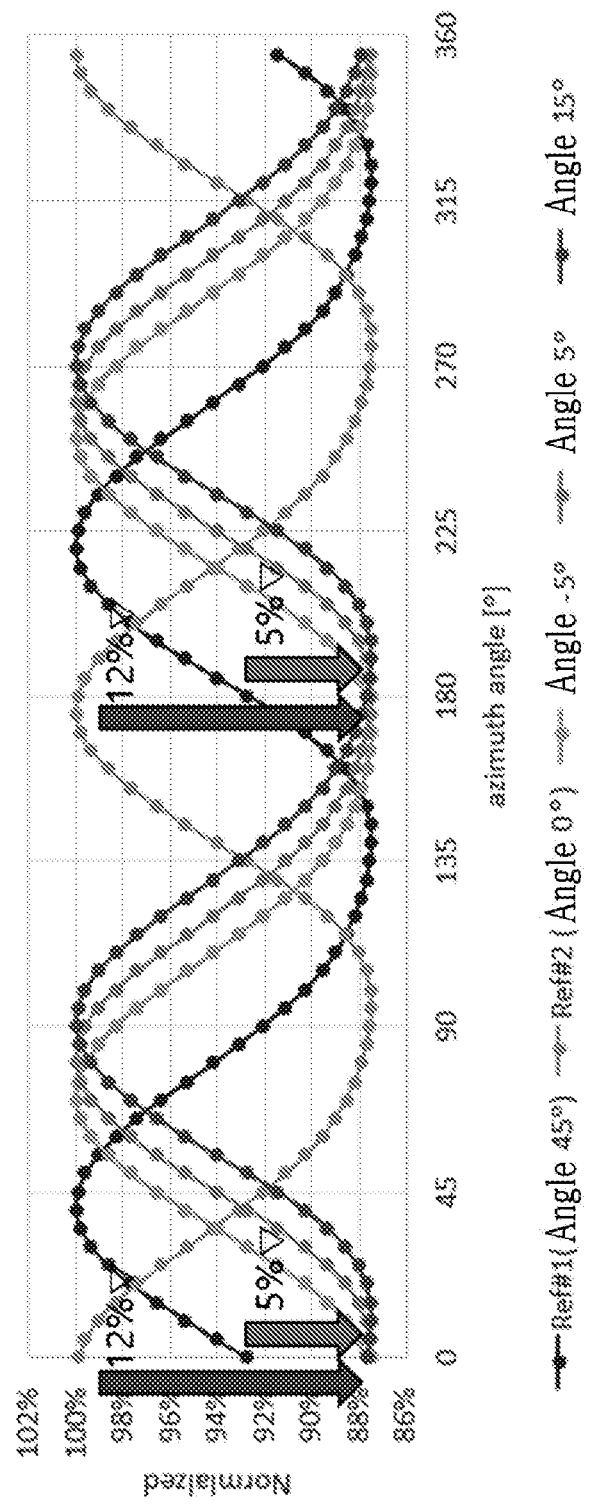
FIG. 8 is a graph showing a reflectance according to an angle between an extension direction of a second metal layer of a touch conductive layer and an absorption axis of a polarization layer in a display device according to an embodiment.

FIG. 8 is a graph showing reflectance according to an angle between an extension direction of a second metal layer of a touch conductive layer and an absorption axis of a polarization layer in a display device according to an embodiment.

FIG. 8 shows the reflectance measured at a polar angle of 45° when the first direction x, the second direction y and the third direction z are represented by an x-axis, a y-axis, and a z-axis of a spherical coordinate system, respectively. When the angle a between the extension direction of the second conductive line L2 corresponding to the second direction y and the optical axis X1 of the polarization layer 330 is 0°, the reflectance at azimuth angles 0° and 180° corresponding to a side viewing angle vulnerable to the reflected light represents a maximum value of 100%. When the angle a was 45°, the reflectance was about 93% at the azimuth angles 0° and 180°. When the angle a was −5°, 5°, or 15°, the reflectance was about 88% at 0° and 180° in azimuth. Therefore, when disposing the polarization layer 330 in a way such that the angle a is about 5±10° as in the above-described embodiment, the reflectance was improved by about 12% compared to a case where the angle a was 0°, and the reflectance was improved by about 5% compared to a case where the angle a was 45°. As in the embodiment, the optical axis X1 of the polarization layer 330 may be disposed in way such that the reflectance is minimized at the lateral viewing angle where the pattern of the touch conductive layer is easily recognized, the pattern of the touch conductive layer may be effectively prevented from being visually recognized.

Figure 9:
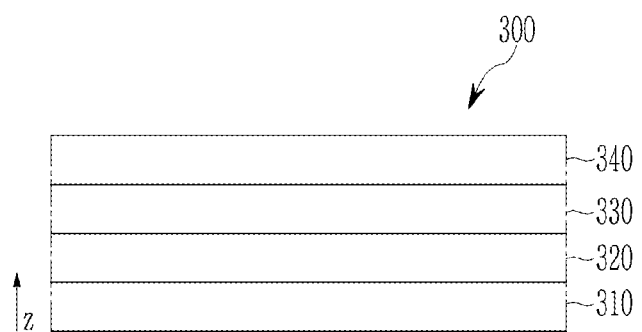
FIG. 9 is a schematic cross-sectional view of a reflection preventing layer in a display device according to an embodiment.
Figure 10:
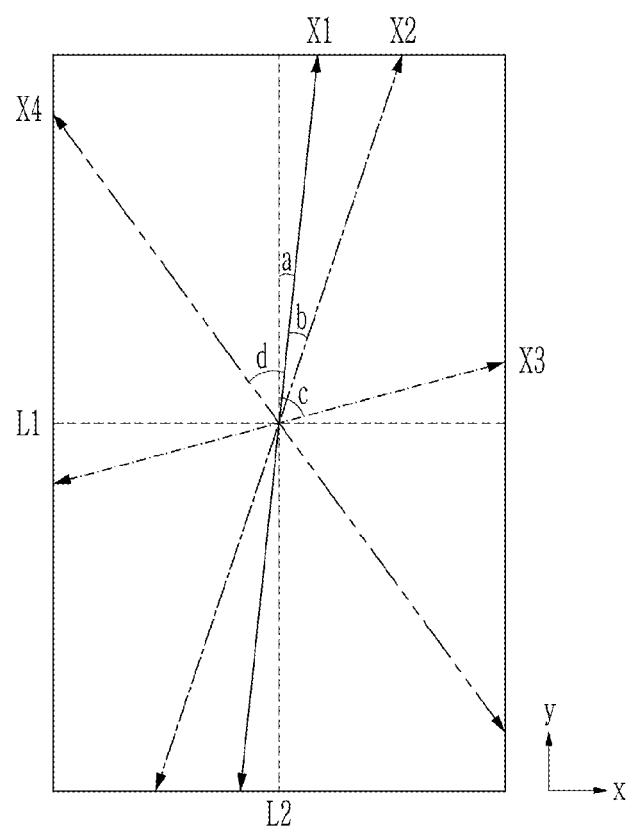
FIG. 10 is a view showing an arrangement of a reflection preventing unit in a display device according to an embodiment.

FIG. 9 is a schematic cross-sectional view of a reflection preventing layer in a display device according to an embodiment, and FIG. 10 is a view showing an arrangement of a reflection preventing unit in a display device according to an embodiment.

Referring to FIG. 9 and FIG. 10, an embodiment of the reflection preventing unit 300 may include a first phase retardation layer 310, a second phase retardation layer 320, a polarization layer 330, and a third phase retardation layer 340, which are sequentially disposed one on another. The embodiment shown in FIG. 9 and FIG. 10 is substantially the same as the embodiment described above with reference to FIGS. 5 to 8 except that the reflection preventing unit 300 further includes the third phase retardation layer 340 positioned on the polarization layer 330. The third phase retardation layer 340 may have a λ/4 phase retardation value. The angle d between the optical axis X1 of the polarization layer 330 and the optical axis X4 of the third phase retardation layer 340 may be about −45° or about 45°. In an embodiment, for example, where the angle a between the second direction y and the optical axis X1 is 5°, the angle between the second direction y and the optical axis X4 may be about −40° or about 50°. The optical axis X4 may be the absorption axis of the third phase retardation layer 340.

When setting the angle a as in the embodiment described above, if a user wears polarization sunglasses and looks at the display device, the optical axis X1 of the polarization layer 330 and the optical axis (the absorption axis) of the sunglasses may cross approximately vertically. For example, the absorption axis of the sunglasses may be roughly parallel to the first direction x. Then, since the light that has passed through the polarization layer 330 does not pass through or hardly transmits through the sunglasses, it is impossible to see the image displayed by the display device while wearing the sunglasses. In an embodiment, the third phase retardation layer 340 is further disposed on the polarization layer 330, such that the linearly polarized light may be converted into circularly polarized light, and the circularly polarized light may be converted into the linearly polarized light while passing through the sunglasses. Therefore, the user wearing the sunglasses may see the image provided by the linearly polarized light. The reflection preventing unit 300 including such a third phase retardation layer 340 may be included in the display device mainly used outdoors in the environment in which the user may wear sunglasses.

Figure 11:
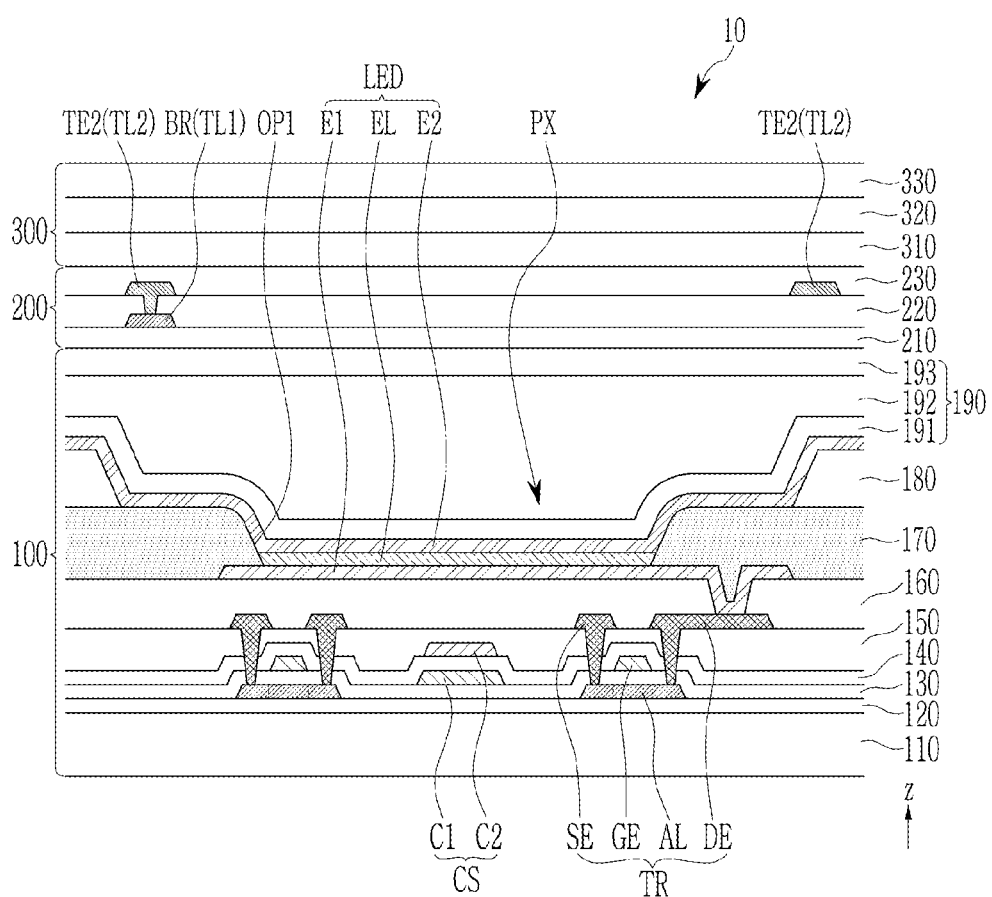
FIG. 11 is a schematic cross-sectional view of a display panel according to an embodiment.

FIG. 11 is a schematic cross-sectional view of a display panel according to an embodiment.

Referring to FIG. 11, an embodiment of the display panel 10 may include a display unit 100, a touch unit 200, and a reflection preventing unit 300.

The display unit 100 may include a substrate 110, a transistor TR disposed on the substrate 110, and a light emitting diode LED connected to the transistor TR. The light emitting diode LED may correspond to the pixel PX.

In an embodiment, the substrate 110 may be a flexible substrate including a polymer such as a polyimide, a polyamide, or polyethylene terephthalate. Alternatively, the substrate 110 may be a rigid substrate including glass.

A buffer layer 120 may be positioned on the substrate 110. The buffer layer 120 improves the characteristics of the semiconductor layer AL by blocking an impurity from the substrate 110 when the semiconductor layer AL is formed, and may relieve the stress of the semiconductor layer AL by flattening the surface of the substrate 110. The buffer layer 120 may include an inorganic insulating material such as a silicon nitride (SiNx), a silicon oxide (SiOx), or a silicon oxynitride (SiOxNy). The buffer layer 120 may include amorphous silicon.

The semiconductor layer AL may be positioned on the buffer layer 120. The semiconductor layer AL may include a first region, a second region, and a channel region between the first and second regions. The semiconductor layer AL may include polysilicon, amorphous silicon, or an oxide semiconductor.

A first gate insulating layer 130 may be positioned on the semiconductor layer AL. The first gate insulating layer 130 may include an inorganic insulating material such as a silicon oxide, a silicon nitride, or a silicon oxynitride, and may be defined by a single layer or multiple layers, that is, have a single layer structure or a multilayer structure.

A first gate conductive layer including a gate electrode GE may be positioned on the first gate insulating layer 130. The first gate conductive layer may include molybdenum (Mo), aluminum (Al), copper (Cu), titanium (Ti), tungsten (W), or the like, and may be defined by a single layer or multiple layers.

A second gate insulating layer 140 may be positioned on the first gate conductive layer. The second gate insulating layer 140 may include an inorganic insulating material such as a silicon nitride, a silicon oxide, or a silicon oxynitride, and may be defined by a single layer or multiple layers.

A second gate conductive layer that may include a second electrode C2 of a storage capacitor CS may be positioned on the second gate insulating layer 140. The second electrode C2 may overlap the first electrode C1, and the first electrode C1, the second electrode C2, and the second gate insulating layer 140 therebetween may constitute the storage capacitor CS. The second gate conductive layer may include molybdenum (Mo), aluminum (Al), copper (Cu), titanium (Ti), tungsten (W), or the like, and may be defined by a single layer or multiple layers.

An interlayer insulating layer 150 may be positioned on the second gate conductive layer. The interlayer insulating layer 150 may include an inorganic insulating material such as a silicon nitride, a silicon oxide, or a silicon oxynitride, and may be defined by a single layer or multiple layers. In an embodiment, where the interlayer insulating layer 150 has a multilayer structure, the lower layer may include a silicon nitride and the upper layer may include a silicon oxide. A first data conductive layer that may include a first electrode SE and a second electrode DE of the transistor TR may be positioned on the interlayer insulating layer 150. One of the first electrode SE and the second electrode DE may be a source electrode of the transistor TR, and the other of the first electrode SE and the second electrode DE may be a drain electrode of the transistor TR. The first data conductive layer may include aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), copper (Cu), or the like, and may be defined by a single layer or a multilayer. In an embodiment, for example, the first data conductive layer may have a triple-layer structure such as titanium (Ti)/aluminum (Al/titanium (Ti), or a double-layer structure such as titanium (Ti)/copper (Cu).

A planarization layer 160 may be positioned on the first data conductive layer. The planarization layer 160 may include organic insulating materials such as a general-purpose polymer such as poly(methyl methacrylate) and polystyrene, a derivative of a polymer having a phenolic group, an acryl-based polymer, an imide-based polymer (e.g., polyimide), or a siloxane-based polymer.

A pixel electrode E1 of the light emitting diode LED may be positioned on the planarization layer 160. The pixel electrode E1 may be connected to the second electrode DE through a contact hole defined or formed in the planarization layer 160. The pixel electrode E1 may include or be formed of a reflective conductive material or a semi-transmissive conductive material, or may also include or be formed of a transparent conductive material. The pixel electrode E1 may include a transparent conductive material such as indium tin oxide (ITO) or indium zinc oxide (IZO). The pixel electrode E1 may include a metal such as lithium (Li), calcium (Ca), aluminum (Al), silver (Ag), magnesium (Mg), or gold (Au). The pixel electrode E1 may have a multi-layer structure, for example, a triple-layer structure such as ITO/silver (Ag)/ITO.

A partition 170 (also referred to as a pixel defining layer or a bank) with an opening OP1 defined therethrough to overlap the pixel electrode E1 may be positioned on the planarization layer 160. The partition 170 may define a light emitting region. The partition 170 may include an organic insulating material such as an acryl-based polymer, an imide-based polymer (e.g., polyimide), or an amide-based polymer (e.g., polyamide). The partition 170 may be a black partition including colored pigments such as black pigments and blue pigments. In an embodiment, for example, the partition 170 may include a polyimide binder and a mixed pigment of red, green, and blue. In an embodiment, for example, the partition 170 may include a cardo binder resin and a mixture of a lactam black pigment and blue pigment. The partition 170 may include carbon black. The black partition may improve a contrast ratio and prevent a reflection by the underlying metal layer.

An emission layer EL may be positioned on the pixel electrode E1. At least a portion of the emission layer EL may be positioned within the opening OP1 of the partition 170. The emission layer EL may include a material layer that emits light of one of primary colors such as red, green, and blue. The emission layer EL may have a structure in which material layers that emit light of different colors are stacked one on another. In an embodiment, at least one of a hole injection layer, a hole transport layer, an electron transport layer, and an electron injection layer may be positioned on the pixel electrode E1 in addition to the emission layer EL.

A spacer 180 may be positioned on the partition 170. The spacer 180 may include an organic insulating material such as an acryl-based polymer, an imide-based polymer, or an amide-based polymer.

A common electrode E2 (also called an opposed electrode) may be positioned on the emission layer EL and the partition 170. The common electrode E2 may be positioned over a plurality of pixels PX. The common electrode E2 may include a metal such as is calcium (Ca), barium (Ba), magnesium (Mg), aluminum (Al), silver (Ag), platinum (Pt), palladium (Pd), gold (Au), nickel (Ni), neodymium (Nd), iridium (Ir), chromium (Cr), and lithium (Li). The common electrode E2 may include a transparent conductive oxide (TCO) such as indium tin oxide (ITO) or indium zinc oxide (IZO).

The pixel electrode E1, the emission layer EL, and the common electrode E2 may constitute a light emitting diode LED, which may be an organic light emitting diode. The pixel electrode E1 may be an anode serving as a hole injection electrode, and the common electrode E2 may be a cathode serving as an electron injection electrode, and vice versa. The opening OP1 of the partition 170 may correspond to a light emitting region of the light emitting diode LED.

An encapsulation layer 190 may be positioned on the common electrode E2. The encapsulation layer 190 may seal the light emitting diode LED and may prevent penetration of moisture or oxygen from the outside. The encapsulation layer 190 may be a thin film encapsulation layer including at least one inorganic layer and at least one organic layer stacked on the common electrode E2. In an embodiment, for example, the encapsulation layer 190 may have a triple layer structure of a first inorganic layer 191, an organic layer 192, and a second inorganic layer 193.

The first insulating layer 210 of the touch unit 200 may be positioned on the encapsulation layer 190. The first insulating layer 210 may cover the encapsulation layer 190 to protect the encapsulation layer 190 and prevent moisture permeation. The first insulating layer 210 may reduce a parasitic capacitance between the common electrode E2 and the touch electrodes TE1 and TE2.

A first touch conductive layer TL1, which may include a second bridge BR2, may be positioned on the first insulating layer 210. The second insulating layer 220 may be positioned on the first touch conductive layer TL1. A second touch conductive layer TL2 that may include touch electrodes TE1 and TE2 may be positioned on the second insulating layer 220. A passivation layer 230 may be positioned on the second touch conductive layer TL2. Referring back to FIG. 3, the touch electrodes TE1 and TE2 may include first touch electrodes TE1 and second touch electrodes TE2 that form a mutual sensing capacitor. The second bridge BR2 may electrically connect to the second touch electrodes TE2. In an embodiment, for example, the adjacent and separated second touch electrodes TE2 may be connected to the second bridge BR2 through contact holes defined or formed in the second insulating layer 220 and electrically connected to each other through the second bridge BR2.

The first insulating layer 210 and the second insulating layer 220 may include an inorganic insulating material such as a silicon nitride, a silicon oxide, or a silicon oxynitride, and may be defined by a single layer or multiple layers. The passivation layer 230 may include an organic insulating material such as an acryl-based polymer, an imide-based polymer, or an inorganic insulating material such as a silicon nitride, a silicon oxide, and a silicon oxynitride.

An opening may be defined in the first touch conductive layer TL1 and the second touch conductive layer TL2 to overlap the light emitting region of the light emitting diode LED. The first touch conductive layer TL1 and the second touch conductive layer TL2 include or are formed of metals such as aluminum (Al), copper (Cu), titanium (Ti), molybdenum (Mo), silver (Ag), chromium (Cr), and nickel (Ni), and may be defined by a single layer or multiple layers. In an embodiment, for example, the first touch conductive layer TL1 and/or the second touch conductive layer TL2 may have a triple layer structure such as titanium (Ti)/aluminum (Al)/titanium (Ti).

A reflection preventing unit 300 may be positioned on the passivation layer 230. The reflection preventing unit 300 may include a first phase retardation layer 310, a second phase retardation layer 320, and a polarization layer 330 sequentially positioned on the passivation layer 230.

Figure 12:
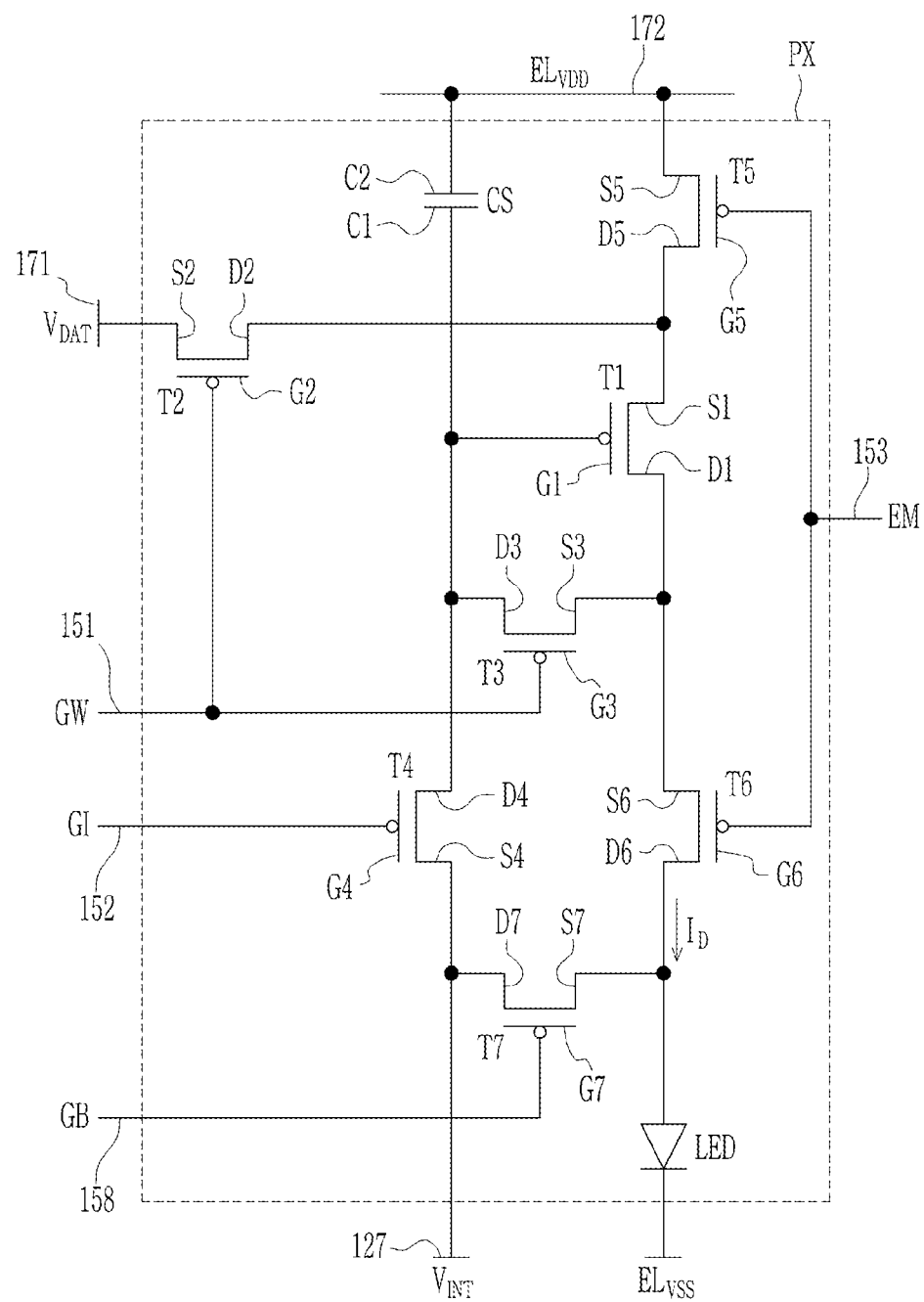
FIG. 12 is a circuit diagram of a pixel of a display device according to an embodiment.

FIG. 12 is a circuit diagram of a pixel of a display device according to an embodiment.

Referring to FIG. 12, an embodiment of the pixel PX may include transistors T1-T7, a storage capacitor CS, and a light emitting diode LED, which are connected to signal lines 127, 151, 152, 153, 158, 171, and 172.

The transistors T1-T7 includes a driving transistor T1, a switching transistor T2, a compensation transistor T3, an initialization transistor T4, an operation control transistor T5, a light emission control transistor T6, and a bypass transistor T7.

The signal lines 127, 151, 152, 153, 158, 171, and 172 may include an initialization voltage line 127, a scan line 151, a previous scan line 152, a light emission control line 153, a bypass control line 158, a data line 171, and a driving voltage line 172.

The scan line 151 may transmit a scan signal GW to the switching transistor T2 and the compensation transistor T3. The previous scan line 152 may transmit a previous scan signal GI to the initialization transistor T4. The light emission control line 153 may transmit an emission control signal EM to the operation control transistor T5 and the emission control transistor T6. The bypass control line 158 may transmit a bypass signal GB to the bypass transistor T7. The bypass control line 158 may be connected to the previous scan line 152.

The data line 171 may receive a data voltage $V_{DAT}$, and the driving voltage line 172 and the initialization voltage line 127 may receive a driving voltage $EL_{VDD}$ and an initialization voltage $V_{INT}$, respectively. The initialization voltage $V_{INT}$ may initialize the driving transistor T1.

The transistors T1 to T7 include gate electrodes G1 to G7, first electrodes S1 to S7, and second electrodes D1 to D7, respectively, and the storage capacitor CS includes a first electrode C1 and a second electrode C2. The electrodes of the transistors T1 to T7 and the storage capacitor CS may be connected as shown in FIG. 15. The anode of the light emitting diode LED may be connected to the second electrode D1 of the driving transistor T1 through the emission control transistor T6 and may receive a driving current $I_D$ supplied thereto. The cathode of the light emitting diode LED may receive a common voltage $EL_{VSS}$ (also referred to as a second power voltage or a low potential power voltage).

In the circuit structure of the pixel PX, the number and type of the transistors, the number of the capacitors, and the connections therebetween may be variously modified.

The invention should not be construed as being limited to the embodiments set forth herein. Rather, these embodiments are provided so that this disclosure will be thorough and complete and will fully convey While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. A display device comprising:
   a display unit including a plurality of light emitting diodes;
   a touch unit disposed on the display unit and including a touch conductive layer of a mesh type; and
   a reflection preventing unit disposed on the touch unit and including a polarization layer,
   wherein the touch conductive layer includes touch electrodes and a bridge defined by a metal mesh including a plurality of first conductive lines extending in a first direction and a plurality of second conductive lines extending in a second direction crossing the first direction,
   wherein the bridge connects adjacent touch electrodes to each other, and
   wherein the bridge has an approximate ladder shape, and a short side and a long side of the ladder shape are parallel to the first direction and the second direction, respectively, and
   wherein an angle between an extending direction of the long side of the ladder shape and an absorption axis of the polarization layer is about 5±10°.

2. The display device of claim 1, wherein
   the reflection preventing unit further includes:
   a first phase retardation layer disposed between the touch unit and the polarization layer and having a λ/4 phase retardation value; and
   a second phase retardation layer disposed between the first phase retardation layer and the polarization layer and having a λ/2 phase retardation value.

3. The display device of claim 2, wherein
an angle between the absorption axis of the polarization layer and an optical axis of the first phase retardation layer is about 12.5±5°.

4. The display device of claim 2, wherein
an angle between the absorption axis of the polarization layer and an optical axis of the second phase retardation layer is about 72.5±5°.

5. The display device of claim 2, wherein
the reflection preventing unit further includes a third phase retardation layer disposed on the polarization layer and having a λ/4 phase retardation value.

6. The display device of claim 5, wherein
an angle between the absorption axis of the polarization layer and an optical axis of the third phase retardation layer is about −45° or about 45°.

7. The display device of claim 1, wherein
the touch conductive layer includes a first touch conductive layer and a second touch conductive layer disposed in different layers from each other with an insulating layer interposed therebetween.

8. The display device of claim 7, wherein
the touch unit includes a first insulating layer, a first touch conductive layer disposed on the first insulating layer, a second insulating layer disposed on the first touch conductive layer, and a second touch conductive layer disposed on the second insulating layer.

9. The display device of claim 8, wherein
the second touch conductive layer includes a plurality of first touch electrodes arranged in the first direction, a plurality of second touch electrodes arranged in the second direction, and a plurality of first bridges connecting the plurality of first touch electrodes to each other, and
the first touch conductive layer includes a plurality of second bridges connecting the plurality of second touch electrodes to each other.

10. The display device of claim 9, wherein
a portion constituting the first bridge among the plurality of first conductive lines overlaps a portion constituting the second bridge among the plurality of second conductive lines.

11. A display device comprising:
a display unit including pixels;
a touch unit disposed on the display unit, wherein the touch unit includes a first touch conductive layer and a second touch conductive layer; and
a reflection preventing unit disposed on the touch unit, wherein the reflection preventing unit includes a first phase retardation layer, a second phase retardation layer, and a polarization layer,
wherein each of the first touch conductive layer and the second touch conductive layer includes a first conductive line extending in a horizontal direction and a second conductive line extending in a vertical direction,
wherein a portion of the first touch conductive layer has an approximate ladder shape, and a short side and a long side of the ladder shape are parallel to the horizontal direction and the vertical direction, respectively, and
an angle between an extension direction of the long side of the ladder shape and an absorption axis of the polarization layer is about 5±10°.

12. The display device of claim 11, wherein
the first phase retardation layer has a λ/4 phase retardation value, and
the second phase retardation layer has a λ/2 phase retardation value.

13. The display device of claim 12, wherein
an angle between the absorption axis of the polarization layer and an optical axis of the first phase retardation layer is about 12.5±5°.

14. The display device of claim 12, wherein
an angle between the absorption axis of the polarization layer and an optical axis of the second phase retardation layer is about 72.5±5°.

15. The display device of claim 12, wherein
the first phase retardation layer, the second phase retardation layer, and the polarization layer are sequentially disposed on the touch unit.

16. The display device of claim 11, wherein
the reflection preventing unit further includes a third phase retardation layer having a λ/4 phase retardation value.

17. The display device of claim 16, wherein an angle between the absorption axis of the polarization layer and an optical axis of the third phase retardation layer is about −45° or about 45°.

18. The display device of claim 11, wherein
the touch unit further includes a first insulating layer, and a second insulating layer disposed on the first touch conductive layer, wherein the first touch conductive layer is disposed on the first insulating layer, and the second touch conductive layer is disposed on the second insulating layer.

19. The display device of claim 18, wherein
the second touch conductive layer includes a plurality of first touch electrodes, a plurality of second touch electrodes, and a plurality of first bridges connecting the plurality of first touch electrodes to each other, and the first touch conductive layer includes a plurality of second bridges connecting the plurality of second touch electrodes to each other.

20. The display device of claim 18, wherein
the first conductive line of the second touch conductive layer includes a portion overlapping the second conductive line of the first touch conductive layer.

* * * * *